United States Patent [19]
Higashi et al.

[11] Patent Number: 6,013,556
[45] Date of Patent: Jan. 11, 2000

[54] METHOD OF INTEGRATED CIRCUIT FABRICATION

[75] Inventors: Gregg Sumio Higashi, Orlando; Mon-Fen Hong, Sebring, both of Fla.; Lionel Cooper Kimerling, Concord, Mass.; Yi Ma, Orlando, Fla.

[73] Assignee: Lucent Technologies Inc., Murray Hill, N.J.

[21] Appl. No.: 08/924,728

[22] Filed: Sep. 5, 1997

[51] Int. Cl.[7] .......................... H01L 21/76; H01L 21/322
[52] U.S. Cl. ............................. 438/402; 438/471
[58] Field of Search ..................................... 438/402, 471

[56] References Cited

U.S. PATENT DOCUMENTS 4,868,133  9/1989  Huber .
5,757,063  5/1998  Tomita et al. .

OTHER PUBLICATIONS

Woijciechowski, U., Internal Gettering Effectiveness for Transition Metals/Fe, Ni/in Cz–Si, Proceedings of the 4th International Autumn Meeting—Gettering and Defect Engineering in Semiconductor Technology; Abstract, 1991.

*Primary Examiner*—John F. Niebling
*Assistant Examiner*—Josetta Jones
*Attorney, Agent, or Firm*—Anthony Grillo

[57] ABSTRACT

Crochralski wafers are desirably thermally processed at an elevated temperature prior to integrated circuit fabrication. The thermal processing reduces the number of oxygen nucleation centers and prevents subsequent oxygen precipitation from interfering with iron contamination measurements.

6 Claims, No Drawings

METHOD OF INTEGRATED CIRCUIT FABRICATION

TECHNICAL FIELD

This invention relates to methods for fabricating integrated circuits from semiconductor materials.

BACKGROUND OF THE INVENTION

During factory processing of semiconductor wafers to produce integrated circuits, it is customary to monitor iron contamination of wafer heating apparatus such as furnaces, by Surface Photo Voltage (SPV) measurements made upon bulk test wafers. Bulk test wafers are subjected to, for example, to thermal processing in selected apparatus. Then the iron contamination in the test wafer is measured by SPV. Excessive iron contamination in the test wafer is interpreted as indicative of furnace or process equipment contamination. Thus, the integrated circuit device yield will be lower. With the smaller device dimension and thinner gate oxide thickness, there is less tolerance to the level of contamination. With SPV technique monitoring, earlier detection of contaminants improves yields. The SPV technique measures diffusion lengths in the semiconductor substrate. Abnormally short diffusion lengths are indicative of undesirable contamination. Diffusion length measurements may be made by SPV or Deep Level Transient Spectroscopy (DLTS) techniques. DLTS measurement requires significant amount of time to prepare samples and is not always a convenient technique in manufacturing monitoring.

Unfortunately, wafers made by the Czochralski process (termed Czochralski wafers) have an undesirably high oxygen content. This oxygen precipitates during heating of the wafers and interferes with diffusion length measurements. Consequently, diffusion length measurements performed upon Czochralski test wafers may not provide a reliable indicator of iron contamination.

One solution has been to employ test wafers manufactured by the float zone process, instead of Czochralski wafers. Unfortunately, float zone wafers are very expensive and currently not widely available in eight inch diameters.

Those concerned with the development of integrated circuit processing have consistently sought improved methods evaluating iron contamination of processing.

SUMMARY OF THE INVENTION

Illustratively, the invention includes exposing a wafer to an elevated period of time sufficient to reduce oxygen nucleation centers in the wafer whereby subsequent diffusion length measurements in the wafer are correlatable with iron contamination.

DETAILED DESCRIPTION

Metallic contamination in the integrated circuit manufacturing facility reduces device yield and degrades the device reliability. It is critical to monitor the level of contamination in the process equipment.

With the surface photovoltage technique, the measurement is often incorrect if the conventional Czochralski wafers are used. The interference from oxygen precipitates often make the diffusion length measured with SPV shorter than normal. The erroneous appearance of metallic contamination may be assumed.

The undesirable oxygen precipitation problem experienced with silicon Czochralski wafers may be substantially alleviated by subjecting the wafers to rapid thermal processing before commencement of the evaluation and testing process of the manufacturing apparatus such as a furnace. Illustratively, Czochralski wafers may be thermally processed by ramping the temperature up to 900° C.–1300° C. at a rate of 50° C./sec±20° C./sec. The wafers are held at 900° C.–1300° C. for a period of 5–120 seconds. The thermal processing may be performed in an oxygen atmosphere or an inert atmosphere or a mixture of oxygen and inert gases. This process tends to break up oxygen seeds or nucleation centers, thereby preventing oxygen precipitation in subsequent furnace operations. Consequently, subsequent reliable iron concentration measurements may be subsequently performed with the SPV technique (after the wafers are subsequently exposed to manufacturing apparatus).

Study has shown that the first stage of oxygen precipitation in silicon is nucleation. In the nucleation stage, aggregates of a few oxygen atoms, termed "nuclei" are formed within the silicon lattice. An important parameter in the nucleation process is the "critical radius", $r_c$, which distinguishes the nuclei which grow further upon thermal treatment ($r > r_c$) from those nuclei which are going to dissolve upon thermal treatment ($r < r_c$). It is believed that the process of this invention, the number of nuclei are reduced through a dissolving process.

The inventive technique works ideally with wafers having an oxygen content between 10 ppm and 40 ppm (the lower limit not being a significant problem initially and the upper limit being a high oxygen load).

The invention claimed is:

1. A method of integrated circuit fabrication comprising:

exposing a wafer to an elevated temperature for a period of time sufficient to reduce oxygen nucleation centers in said wafer whereby subsequent diffusion length measurements in said wafer are correlatable with iron contamination.

2. The method of claim 1 in which said temperature is 900° C.–1300° C.

3. The method of claim 2 in which said time is 5–120 sec.

4. The method of claim 1 in which said elevated temperature is achieved by ramping the temperature at a rate of 50° C./sec±20° C./sec.

5. A method of fabricating an integrated circuit comprising:

exposing a wafer to an elevated temperature for a period of time sufficient to reduce oxygen nucleation centers in said wafer whereby subsequent diffusion length measurements in said wafer are correlatable with iron contamination said wafer is termed a "test wafer", and in which said test wafer is exposed to a processing apparatus before said diffusion length is measured and in which if said iron contamination is below a threshold value, a plurality of product wafers are then exposed to said same processing apparatus.

6. A method of fabricating an integrated circuit comprising:

exposing a wafer to an elevated temperature for a period of time sufficient to reduce oxygen nucleation centers in the wafer whereby subsequent diffusion length measurements in the wafer are correlatable with iron contamination; and performing diffusion length measurements on the wafer.

* * * * *